(12) United States Patent
Tan

(10) Patent No.: US 6,937,028 B2
(45) Date of Patent: Aug. 30, 2005

(54) RESISTOR VALUE DETECTION CIRCUIT

(75) Inventor: Mehmet Ali Tan, Irvine, CA (US)

(73) Assignee: Agere Systems Inc., Allentown, PA (US)

( * ) Notice: Subject to any disclaimer, the term of this patent is extended or adjusted under 35 U.S.C. 154(b) by 106 days.

(21) Appl. No.: 10/452,329

(22) Filed: May 30, 2003

(65) Prior Publication Data

US 2004/0239340 A1 Dec. 2, 2004

(51) Int. Cl.[7] .................... G01R 35/00; G01R 27/08
(52) U.S. Cl. ..................... 324/601; 324/691
(58) Field of Search ................ 324/691–724, 324/649, 601; 331/44, 57, 65, 175

(56) References Cited

U.S. PATENT DOCUMENTS 5,831,849 A * 11/1998 Matsui ................... 700/3
6,753,738 B1 * 6/2004 Baird ..................... 331/25

OTHER PUBLICATIONS

U.S. Appl. No. 10/452,661, filed May 30, 2003, M.A. Tan et al., "Reduced Complexity Linear Phase Detector".
U.S. Appl. No. 10/452,657, filed May 30, 2003, G.A. DeVeirman et al., "Phase–Locked Loop with Loop Select Signal Based Switching Between Frequency Detection and Phase Detection".
U.S. Appl. No. 10/452,091, filed May 30, 2003, M.A. Tan, "Programmable Voltage–Controlled Oscillator with Self-Calibration Feature".

* cited by examiner

Primary Examiner—Vincent Q. Nguyen
Assistant Examiner—Amy He

(57) ABSTRACT

A resistor detection circuit configurable for coupling to an external resistor of an integrated circuit or other type of circuit includes at least one internal resistor, and comparison circuitry associated with the internal resistor. The comparison circuitry is operative to generate, based at least in part on a value of the external resistor, an output indicative of a value of the internal resistor. The output generated by the comparison circuitry may comprise an encoded digital output signal representative of the value of the internal resistor.

16 Claims, 3 Drawing Sheets

RESISTOR VALUE DETECTION CIRCUIT

FIELD OF THE INVENTION

The present invention relates generally to the field of electronic circuits, and more particularly to circuits for use in detecting the value of a resistor in an analog or mixed-signal integrated circuit or other application.

BACKGROUND OF THE INVENTION

In many integrated circuit applications, an operating parameter of an analog or mixed-signal circuit block is determined based at least in part on the value of an internal resistor.

By way of example, a voltage-controlled oscillator (VCO) may include a ring oscillator that is formed of a controllable ring of inverter stages which utilize one or more internal resistors as load devices. Such a VCO may be utilized as an element of a phase-locked loop (PLL) in a clock recovery circuit or other type of circuit. The free-running frequency of the ring oscillator strongly depends on the internal resistor value, at least in part because the associated capacitance value does not vary as much as the resistor value.

A problem that arises in applications such as those described above is that the resistor value is typically subject to an excessively large variation within a given integrated circuit manufacturing process. As a result, for any particular integrated circuit design, integrated circuits manufactured using the same process can have significant differences between the values of their respective internal resistors, and the associated circuit operating parameters.

This problem leads to operating parameter error and other degradation in the achievable performance of the integrated circuits, thereby adversely impacting the production yield of the integrated circuit manufacturing process, and increasing device cost.

Conventional techniques have been unable to provide an adequate solution to the problem of excessive variation in internal resistor value. For example, such techniques generally fail to provide an efficient mechanism for determining the actual value of a given internal resistor in a particular integrated circuit.

A need therefore exists in the art for techniques which permit internal resistor values to be determined in an integrated circuit, so that appropriate adjustments can be made to associated circuit operating parameters in order to account for the actual values.

SUMMARY OF THE INVENTION

The present invention provides a resistor value detection circuit which addresses one or more of the above-identified issues.

In accordance with one aspect of the invention, a resistor value detection circuit is configurable for coupling to an external resistor. The resistor value detection circuit includes at least one internal resistor, and comparison circuitry associated with the internal resistor. The comparison circuitry is operative to generate, based at least in part on a value of the external resistor, an output indicative of a value of the internal resistor.

In the illustrative embodiment, the output generated by the comparison circuitry comprises an encoded digital output signal representative of the value of the internal resistor.

The comparison circuitry may include, by way of example, a current-to-voltage converter, a comparator and a latch. The current-to-voltage converter is coupled to the internal resistor and the external resistor. The comparator has first and second inputs configured to receive respective first and second voltage outputs of the converter, and is operative to compare corresponding first and second voltages and to generate a comparison result. The first voltage output of the converter may comprise a voltage determined at least in part based on a current through the internal resistor. The second voltage output of the converter may comprise an n-bit precision voltage signal determined at least in part based on a current through the external resistor. The latch has an input coupled to an output of the comparator and is operative to store the comparison result. The output of the latch is thus indicative of the value of the internal resistor.

In accordance with another aspect of the invention, the resistor value detection circuit may further include a power-on detection circuit operative to detect a power-on condition in an associated integrated circuit. The power-on detection circuit generates a reset signal which controls storage of the output indicative of the value of the internal resistor at a designated time after detection of the power-on condition.

A resistor value detection circuit in accordance with the invention may be implemented, for example, as a portion of an integrated circuit. As a more particular example, the resistor value detection circuit may be implemented as a component of a VCO which is itself implemented as a portion of an integrated circuit. Such a VCO may be an element of a PLL in a clock recovery circuit. Although particularly well-suited for use in a VCO, the resistor value detection circuit can be used in a wide variety of other circuit applications.

The resistor value detection circuit of the illustrative embodiment provides a particularly efficient mechanism for determining one or more internal resistor values in an integrated circuit or other type of circuit. Appropriate adjustments can then be made to associated circuit operating parameters in order to provide improved performance by accounting for the actual values. This increases the production yield of the integrated circuit manufacturing process, and reduces device cost.

DETAILED DESCRIPTION ON THE INVENTION

The present invention will be illustrated herein in conjunction with an exemplary embodiment of a resistor value detection circuit and associated integrated circuit implementations thereof. It should be understood, however, that the invention is not limited to use with the particular circuitry arrangements of the illustrative embodiment. For example, although particularly well-suited for use in analog or mixed-signal integrated circuit applications, a resistor value detection circuit in accordance with the invention can be used in a wide variety of other integrated circuit applications, as well as in non-integrated circuit applications.

The present invention in the illustrative embodiment to be described below compares an internal resistor value of an integrated circuit with an external precision resistor value, and generates an encoded digital output signal which represents the resistance value of the internal resistor. The internal resistor value can advantageously be used to adjust one or more operating parameters of the integrated circuit, or to otherwise reduce, minimize or eliminate any error in the operating parameter attributable to internal resistor value variation.

The term "resistor" as used herein is intended to include, by way of example and without limitation, a discrete resistor, an integrated resistor, a precision resistor, a resistor implemented utilizing at least one transistor, sets of multiple discrete or integrated transistors, etc. The invention is therefore not limited with regard to the particular types of external and internal resistors that may be used in a given embodiment. The 37 value+ of a given resistor is generally intended to include, again by way of example and without limitation, its resistance value.

Figure 1:
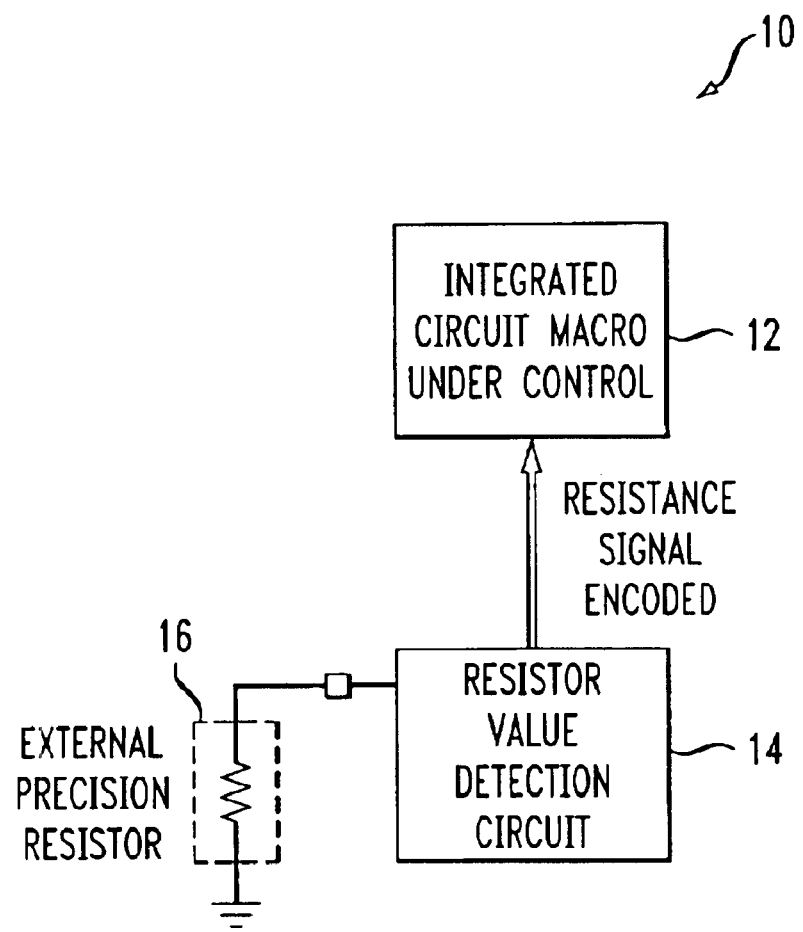
FIG. 1 shows a portion of an integrated circuit which includes a resistor value detection circuit in accordance with an illustrative embodiment of the invention, and is coupled to an associated external resistor.

FIG. 1 shows a portion of an integrated circuit 10 having an integrated circuit macro 12 and a resistor value detection circuit 14. A signal line of the integrated circuit is coupled to an external precision resistor 16. The resistor 16 is "external" in this embodiment in that it is external to the integrated circuit itself. For example, the resistor 16 may comprise an element of a circuit board to which the integrated circuit is mounted. The resistor 16 serves as a value reference for use in determining the value of an "internal" resistor, that is, internal to the resistor value detection circuit 14 of the integrated circuit 10. The integrated circuit macro 12 may represent an analog or mixed-signal circuit block having at least one operating parameter determined based at least in part on the value of the internal resistor. As will be described below with reference to FIG. 4, the integrated circuit macro 12 may comprise a VCO of a PLL in a clock recovery circuit.

The resistor value detection circuit 14 includes comparison circuitry which generates, based at least in part on a value of the external resistor 16, an output indicative of a value of the internal resistor. For example, as will be described in greater detail below with reference to FIGS. 2 and 3, the output generated by the comparison circuitry may comprise an encoded digital output signal representative of the value of the internal resistor. This signal is also denoted in FIG. 1 as an encoded resistance signal, and is supplied from the resistor value detection circuit 14 to the integrated circuit macro 12. The encoded resistance signal may be supplied as a parallel digital signal of a designated n-bit bus width, as a serial signal, or in any other desired format.

An example value of n suitable for use in the illustrative embodiment is three, although other higher or lower values can be used.

The integrated circuit macro 12 may be viewed as being under the control of the resistor value detection circuit 14 in this embodiment in that the encoded resistance signal is used to set, adjust or otherwise control the operating parameter of the integrated macro 12 that is a function of internal resistor value.

Figure 2:
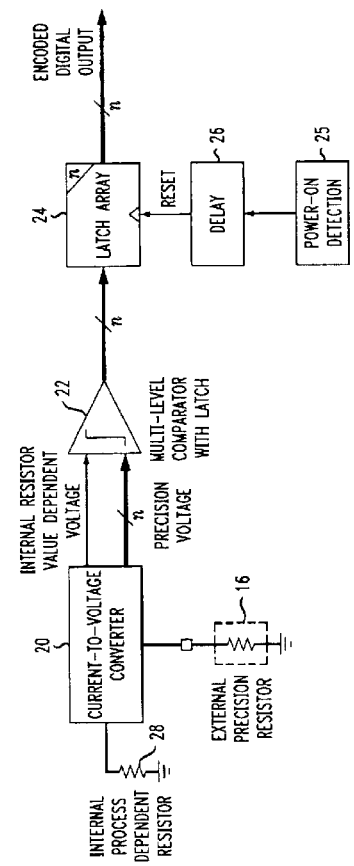
FIG. 2 is a schematic diagram of the resistor value detection circuit of FIG. 1.

FIG. 2 shows the resistor value detection circuit 14 of FIG. 1 in greater detail, and its interconnection with the external precision resistor 16. It is to be appreciated, however, that other interconnection arrangements may be used in coupling the resistor value detection circuit 14 to an external resistor.

The resistor value detection circuit 14 in the example arrangement shown in FIG. 2 includes comparison circuitry comprising a current-to-voltage convertor 20, a multi-level comparator 22 which includes latch circuitry, and a latch array 24. Other types of comparison circuitry may be used in implementing the invention, as will be appreciated by those skilled in the art. For example, comparison circuitry in accordance with the invention need not include the converter or latch elements of the illustrative embodiment.

The resistor value detection circuit 14 further includes a power-on detection circuit 25 coupled to the latch array 24 via a delay element 26.

An internal resistor 28 is also included within the resistor value detection circuit 14. The internal resistor 28 is more specifically denoted in the figure as a process dependent resistor, in that its value may vary depending on process variations associated with manufacture of the corresponding integrated circuit.

The external resistor 16 and internal resistor 28 are each coupled to a corresponding port of the current-to-voltage converter 20. The current-to-voltage converter 20 is operative to convert currents associated with the resistors 16 and 28 to corresponding voltages which are supplied to the multi-level comparator 22. More specifically, the current-to-voltage converter 20 is configured to generate an internal resistor value dependent voltage based on the current through the process dependent resistor 28, and an n-bit precision voltage based on the current through the external precision resistor 16.

The voltages generated by the current-to-voltage converter 20 are supplied to respective inputs of the multi-level comparator 22 as indicated in the figure. The multi-level comparator 22 may be formed of an array of comparators with associated latch elements, and is configured to compare the two voltages supplied by the current-to-voltage converter 20. Each of the bits of the n-bit result of the comparison is stored in a corresponding one of n storage elements of the latch array 24. The output of the latch array 24 is an n-bit encoded resistance signal indicative of the value of the internal resistor 28.

The power-on detection circuit 25 detects whether the integrated circuit power supply voltage has reached a designated usable level during a circuit power-on time. Upon detecting the supply voltage reaching the usable level, the circuit 25 sends a reset signal to the latch array 24. The reset signal is delayed by an amount of delay provided by delay element 26. The reset signal configuration of the resistor value detection circuit 14 thus ensures that the n bits of the determined resistor value are latched only after the circuit power has become sufficiently stable, and remain latched until the next power-on time. This is intended to make the digital output signal steady during the main circuit operation time, that is, independent of any disturbances such as noise, or temperature dependency effects that may occur during that time.

The particular amount of delay provided by delay element 26 is dependent upon implementation-specific factors such as power supply configuration and power-up characteristics, and appropriate values for a given implementation can be readily determined in a straightforward manner.

Figure 3:
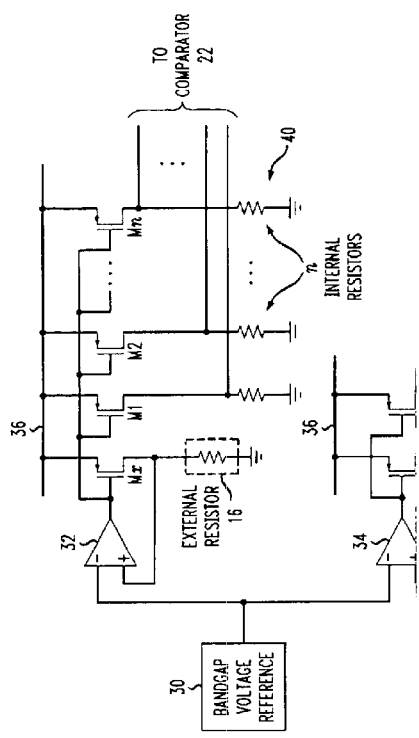
FIG. 3 is a schematic diagram of a current-to-voltage converter in the resistor value detection circuit of FIG. 2.

Any of a number of techniques may be used in the current-to-voltage converter to convert the currents associated with resistors 16 and 28 to corresponding voltage values. FIG. 3 shows a more detailed view of one particular example of a current-to-voltage converter 20 that may be utilized in conjunction with the invention.

The current-to-voltage converter 20 as shown in FIG. 3 includes a bandgap voltage reference 30, unity-gain buffers 32 and 34, and positive supply voltage line 36.

The n-bit precision voltage associated with external precision resistor 16 is generated by copying the bandgap voltage from reference 30 across the resistor 16 to create a current that is mirrored to n additional devices. The output of the unity-gain buffer 32 drives the gate terminal of each of a first P-type metal-oxide-semiconductor (PMOS) device Mx and n additional PMOS devices denoted herein as M1, M2, . . . Mn. The device Mx has a second terminal thereof coupled to the positive supply voltage line 36, and a third terminal thereof coupled to ground potential via the external resistor 16. Similarly, each of the devices M1, M2, . . . Mn has a second terminal thereof coupled to the positive supply voltage line 36, and a third terminal thereof coupled to ground potential via one of n internal resistors 40.

The devices M1, M2, . . . Mn may be configured so as to exhibit incrementally increasing transistor widths. For example, the widths of the devices M1, M2, . . . Mn may be incrementally scaled relative to one another by a designated percentage from device to device. Alternatively, different resistor values may be used for the various resistors in the set of resistors 40 to achieve substantially the same effect as the scaling of the transistor widths. Thus, the voltages created across the n internal resistors 40 will be proportional to the internal resistor value by increment. The voltages across the n internal resistors 40 comprise the n-bit precision voltage supplied from the current-to-voltage converter 20 to the multi-level comparator 22 as previously indicated.

The particular percentage scaling from device to device or resistor to resistor is a function of implementation-specific factors such as the expected process variations. An example value for such percentage scaling may be on the order of 20%, although higher or lower values could be used.

The internal resistor value dependent voltage associated with internal process dependent resistor 28 is generated by copying the bandgap voltage from reference 30 across the resistor 28 to create a current that is mirrored to an additional device. The output of the unity-gain buffer 34 drives the gate terminal of each of a pair of PMOS devices, denoted herein as My and M1'. The device My has a second terminal thereof coupled to the positive supply voltage line 36, and a third terminal thereof coupled to ground potential via the internal resistor 28. Similarly, the device M1' has a second terminal thereof coupled to the positive supply voltage line 36, and a third terminal thereof coupled to ground potential via another internal resistor 42. The voltage across the internal resistor 42 comprises the internal resistor value dependent voltage supplied from the current-to-voltage converter 20 to the multi-level comparator 22.

Numerous other types of current-to-voltage conversion may be used, as will be readily apparent to those skilled in the art. For example, a complementary N-type MOS (NMOS) implementation of the FIG. 3 circuit may be used.

Advantageously, the resistor value detection circuit of the illustrative embodiment provides a particularly efficient mechanism for determining one or more internal resistor values in an integrated circuit. Appropriate adjustments can then be made to associated circuit operating parameters in order to provide improved performance by accounting for the actual values. This increases the production yield of the integrated circuit manufacturing process, and reduces device cost.

A resistor value detection circuit 14 of the type described above can be utilized in a wide variety of integrated circuit applications, including analog or mixed-signal integrated circuit applications.

Figure 4:
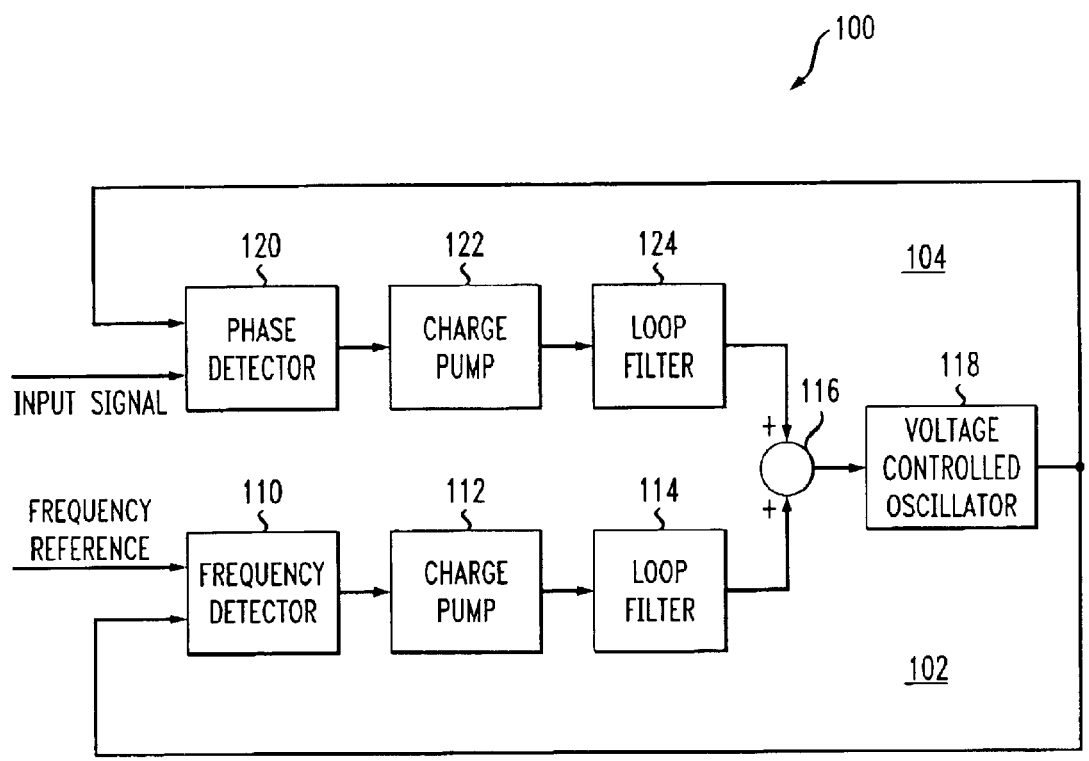
FIG. 4 shows an example of a dual-loop PLL in which a VCO comprising a resistor value detection circuit of the present invention may be implemented.

An example of one such integrated circuit application will now be described in greater detail with reference to FIG. 4, which shows a dual-loop PLL 100 in which the present invention may be implemented.

The dual-loop PLL 100 is of a type described in greater detail in U.S. patent application Ser. No. 10/452,657, entitled "Phase-locked Loop with Loop Select Signal Based Switching Between Frequency Detection and Phase Detection," which is filed concurrently herewith and incorporated by reference herein, now issued as U.S. Pat. No. 6,812,797. It should be noted that, although not shown as such in FIG. 4, the dual-loop PLL 100 may include a loop select signal based switching feature configured as described in the above-cited U.S. Patent Application.

The dual-loop PLL 100 includes a first loop 102 corresponding to a frequency loop and a second loop 104 corresponding to a phase loop.

The frequency loop 102 includes a frequency detector 110, a charge pump 112, a loop filter 114, a signal combiner 116 and a VCO 118. The frequency detector 110 receives as its inputs a frequency reference signal and an output of the VCO 118.

The VCO 118 may comprise a ring oscillator integrated circuit macro and may be configured as indicated in FIG. 1 so as to include a resistor value detection circuit 14 in accordance with the invention. More specifically, an internal resistor value as determined by the resistor value detection circuit 14 may be utilized in conjunction with setting the free-running oscillation frequency of a ring oscillator in the VCO 118.

Additional details regarding the manner in which an internal resistor value as determined by a resistor value detection circuit may be utilized in a ring oscillator are described in U.S. patent application Ser. No. 10/452,091, entitled "Programmable Voltage-Controlled Ring Oscillator," which is filed concurrently herewith and incorporated by reference herein, now issued as U.S. Pat. No. 6,842,082.

The phase loop 104 includes a phase detector 120, a charge pump 122, a loop filter 124, the signal combiner 116 and the VCO 118. The phase detector 120 receives as its inputs an input signal and an output of the VCO 118. For example, in a clock recovery application, the input signal may comprise a data signal to which a clock signal is to be phase locked.

The phase detector 120 is preferably a linear phase detector of the type described in U.S. patent application Ser. No. 10/452,661, entitled "Reduced Complexity Linear Phase Detector," which is filed concurrently herewith and incorporated by reference herein, now issued as U.S. Pat. No. 6,806,740.

As is apparent from the figure, the frequency loop 102 and phase loop 104 are coupled together so as to share a number of loop components, including in this example a series combination of the signal combiner 116 and the VCO 118.

Generally, the frequency loop 102 provides frequency acquisition of the frequency reference signal, and the phase loop 104 provides phase locking of the input signal to the acquired frequency reference signal. Conventional aspects of the operation of these loops and their associated components are well-known in the art, and therefore not further described herein.

It should again be emphasized that the exemplary circuitry arrangements described in conjunction with FIGS. 1 through 4 are intended to illustrate the operation of the invention, and therefore should not be construed as limiting the invention to any particular embodiment or group of embodiments. Furthermore, it will be apparent to those skilled in the art that the particular circuitry shown herein for purposes of illustrating the invention may be implemented in many different ways, and may include additional or alternative elements.

These and numerous other alternative embodiments within the scope of the following claims will therefore be apparent to those skilled in the art.

What is claimed is:

1. A resistor value detection circuit configurable for coupling to an external resistor, the resistor value detection circuit comprising:

at least one internal resistor; and comparison circuitry associated with the internal resistor and operative to generate, based at least in part on a value of the external resistor, an output indicative of a value of the internal resistor;

wherein said comparison circuitry comprises a multi-level comparator, the multi-level comparator performing n comparisons, where n is greater than or equal to two, and generating n outputs representing results of the respective comparisons, the n comparisons comparing a signal having a value dependent on the internal resistor with respective ones of n signals having values dependent on the external resistor, the n outputs of the multi-level comparator being utilizable to provide an encoded resistance signal indicative of the value of the internal resistor.

2. The resistor value detection circuit of claim 1 wherein the output generated by the comparison circuitry comprises an encoded digital output signal representative of the value of the internal resistor.

3. The resistor value detection circuit of claim 1 further comprising a power-on detection circuit operative to detect a power-on condition in an integrated circuit comprising the resistor value detection circuit and to generate a reset signal which controls storage of the output indicative of the value of the internal resistor at a designated time after detection of the power-on condition.

4. The resistor value detection circuit of claim 1 wherein the internal resistor is implemented utilizing at least one transistor.

5. The resistor value detection circuit of claim 1 wherein said resistor value detection circuit is implemented as a component of an integrated circuit.

6. The resistor value detection circuit of claim 1 wherein said resistor value detection circuit is implemented as a component of a voltage-controlled oscillator.

7. The resistor value detection circuit of claim 1 wherein said voltage-controlled oscillator comprises an element of a phase-locked loop in a clock recovery circuit.

8. A resistor value detection circuit configurable for coupling to an external resistor, the resistor value detection circuit comprising:

at least one internal resistor; and comparison circuitry associated with the internal resistor and operative to generate, based at least in part on a value of the external resistor, an output indicative of a value of the internal resistor;

wherein the comparison circuitry further comprises:

a current-to-voltage converter coupled to the internal resistor and the external resistor;

a comparator having a first input configured to receive a first voltage output of the converter and a second input configured to receive a second voltage output of the converter, the comparator being operative to compare the first and second voltage outputs of the converter and to generate a comparison result; and a latch having an input coupled to an output of the comparator and being operative to store the comparison result;

wherein an output of the latch is indicative of the value of the internal resistor.

9. The resistor value detection circuit of claim 8 wherein the first voltage output of the converter comprises a voltage determined at least in part based on a current through the internal resistor.

10. The resistor value detection circuit of claim 8 wherein the second voltage output of the converter comprises an n-bit precision voltage signal determined at least in part based on a current through the external resistor.

11. The resistor value detection circuit of claim 8 wherein the current-to-voltage converter further comprises:

a voltage reference;

first and second buffers, each having a first input coupled to an output of the voltage reference and a second input coupled to one of the internal resistor and the external resistor;

a first set of MOS devices driven by an output of the first buffer; and a second set of MOS devices driven by an output of the second buffer;

wherein the first voltage output of the converter comprises at least one signal line coupled to a corresponding output terminal of one of the MOS devices in the first set of MOS devices; and wherein the second voltage output of the converter comprises at least one signal line coupled to a corresponding output terminal of one of the MOS devices in the second set of MOS devices.

12. The resistor value detection circuit of claim 8 further comprising a power-on detection circuit having an output coupled to a control input of the latch, the power-on detection circuit being operative to detect a power-on condition in an integrated circuit comprising the resistor value detection circuit and to generate a reset signal which is applied to the control input of the latch.

13. An integrated circuit comprising:

a resistor value detection circuit configurable for coupling to an external resistor, the resistor value detection circuit comprising an internal resistor and comparison circuitry associated with the internal resistor, the comparison circuitry being operative to generate, based at least in part on a value of the external resistor, an output indicative of a value of the internal resistor; and at least one additional circuit coupled to the resistor value detection circuit and having an operating parameter thereof determinable based at least in part on the value of the internal resistor;

wherein said comparison circuitry comprises a multi-level comparator, the multi-level comparator performing n comparisons, where n is greater than or equal to two, and generating n outputs representing results of the respective comparisons, the n comparisons comparing a signal having a value dependent on the internal resistor with respective ones of n signals having values dependent on the external resistor, the n outputs of the multi-level comparator being utilizable to provide an encoded resistance signal indicative of the value of the internal resistor.

14. The integrated circuit of claim 13 wherein the additional circuit comprises a voltage-controlled oscillator and the operating parameter comprises a free-running oscillation frequency associated with the voltage-controlled oscillator.

15. The integrated circuit of claim 14 wherein the voltage-controlled oscillator comprises an element of a phase-locked loop in a clock recovery circuit.

16. A method comprising the steps of:

providing a resistor value detection circuit configurable for coupling to an external resistor, the resistor value detection circuit comprising at least one internal resistor; and generating in the resistor value detection circuit, based at least in part on a value of the external resistor, an output indicative of a value of the internal resistor;

wherein said generating step comprises performing n comparisons, where n is greater than or equal to two, and generating n outputs representing results of the respective comparisons, the n comparisons comparing a signal having a value dependent on the internal resistor with respective ones of n signals having values dependent on the external resistor, the n outputs being utilizable to provide an encoded resistance signal indicative of the value of the internal resistor.

* * * * *

UNITED STATES PATENT AND TRADEMARK OFFICE
CERTIFICATE OF CORRECTION

PATENT NO. : 6,937,028 B2
DATED : August 30, 2005
INVENTOR(S) : M.A. Tan

It is certified that error appears in the above-identified patent and that said Letters Patent is hereby corrected as shown below:

<u>Column 7,</u>
Line 54, delete "1" and insert -- 6 --.

Signed and Sealed this

Twenty-fifth Day of April, 2006

JON W. DUDAS
*Director of the United States Patent and Trademark Office*